(12) United States Patent
Filippenko et al.

(10) Patent No.: US 9,031,800 B2
(45) Date of Patent: May 12, 2015

(54) POWER DETERMINATION FROM SEPARATED VOLTAGE AND CURRENT SENSORS

(75) Inventors: Alexander S. Filippenko, Cary, NC (US); Scott R. Brown, Wake Forest, NC (US); Paul R. Buda, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 668 days.

(21) Appl. No.: 13/182,154

(22) Filed: Jul. 13, 2011

(65) Prior Publication Data

US 2013/0018609 A1    Jan. 17, 2013

(51) Int. Cl.
| | | |
|---|---|---|
| *G01R 21/133* | (2006.01) | |
| *G01R 21/06* | (2006.01) | |
| *G01R 21/00* | (2006.01) | |
| *G01R 19/00* | (2006.01) | |
| *G01R 22/06* | (2006.01) | |

(52) U.S. Cl.
CPC .............. *G01R 21/133* (2013.01); *G01R 21/06* (2013.01); *G01R 22/063* (2013.01)

(58) Field of Classification Search
CPC .. G01R 19/175; G01R 19/2513; G01R 21/00; G01R 22/063
USPC .......................................................... 702/62
See application file for complete search history.

(56) References Cited

U.S. PATENT DOCUMENTS

| | | | | |
|---|---|---|---|---|
| 5,848,072 | A * | 12/1998 | Prill et al. ...................... | 370/471 |
| 6,175,780 | B1 * | 1/2001 | Engel ............................ | 700/293 |
| 6,459,257 | B1 * | 10/2002 | Kock ............................ | 324/142 |
| 6,571,182 | B2 * | 5/2003 | Adamiak et al. ................ | 702/64 |
| 7,680,234 | B2 * | 3/2010 | Colby et al. ................... | 375/376 |
| 2004/0183522 | A1 | 9/2004 | Gunn et al. | |
| 2005/0083206 | A1 * | 4/2005 | Couch et al. .................. | 340/657 |
| 2007/0085518 | A1 | 4/2007 | Buda | |

FOREIGN PATENT DOCUMENTS

| | | |
|---|---|---|
| EP | 2108967 A1 | 10/2009 |
| EP | 2009124833 A1 | 10/2009 |

(Continued)

OTHER PUBLICATIONS

Schmid, Thomas; Culler, David; Dutta, Prabal; Meter Any Wire, Anywhere by Virtualizing the Voltage Channel; Nov. 10, 2010; ACM.*

(Continued)

*Primary Examiner* — Eliseo Ramos Feliciano
*Assistant Examiner* — Terence Stifter, Jr.
(74) *Attorney, Agent, or Firm* — Coats & Bennett, PLLC

(57) ABSTRACT

Power measurement by tracking of a voltage cycle when voltage and current measurements are taken at different locations on an AC power line, with the devices taking the measurements interconnected by an asynchronous data network. In general, a synchronization/timing message is sent from the voltage sensing side to the current sensing side, with the synchronization/timing message being transmitted at a predetermined point in the periodic voltage cycle. The receipt of the synchronization/timing message by the current sensing side may be used to re-synchronize an internal model of the voltage cycle maintained by the current sensing side to the measured voltage cycle. The predetermined point in the voltage cycle may be the zero-crossing point, or other point, of the voltage cycle.

18 Claims, 3 Drawing Sheets

(56) References Cited

FOREIGN PATENT DOCUMENTS

| JP | 2005189012 A | 7/2005 |
|---|---|---|
| WO | 2009140777 A1 | 11/2009 |
| WO | WO 2009140777 A1 * | 11/2009 |

OTHER PUBLICATIONS

International Search Report (mailed Nov. 16, 2012, pp. 1-4) in re: International Application No. PCT/US2012/046374.

* cited by examiner

POWER DETERMINATION FROM SEPARATED VOLTAGE AND CURRENT SENSORS

BACKGROUND

The invention relates to power measurements, and particularly to power measurements based on voltage and current measurements taken at separate locations.

For various reasons, it is often useful to know the amount of power being drawn on a particular branch circuit. To do so, a measured RMS current draw on the branch line is sometimes multiplied by a measured RMS voltage value over one or more line cycles to calculate the commonly known apparent power. However, it may be desirable to determine a more accurate value of the real power being drawn, one that takes into account the phase of the voltage cycle when an instantaneous current measurement is taken. If the voltage and current are measured at the same time and at the same place on the power circuit, accurately determining the power is fairly straightforward.

However, measuring voltage and current at the same location presents some challenges, and typically places additional restrictions on the current measuring side circuitry that might not be present if the current measurement were taken at a different location. For example, for safety, fire prevention, and other considerations, it is desirable and often mandated to maintain a high level of galvanic isolation between energized conductors and the circuitry used to measure the voltage between conductors and the current flowing through conductors. Measuring the voltage on energized conductors in a manner that maintains a high degree of galvanic isolation between the measuring device and the device receiving the measurement is expensive, and the cost of making individual voltage measurements when a plurality of branch circuits are to be monitored can be high enough to preclude widespread use of such an arrangement. In contrast, it is typically significantly simpler to generate signals responsive to instantaneous current with high levels of galvanic isolation, at least in situations where the current is periodic with zero mean, because magnetic coupling can be used to generate the current responsive signal. A understood current transformer is one example of a commonly known device that can generate a current responsive signal, with the electrically conductive components of the current transformer isolated from the voltage on the current carrying conductor(s) via a combination of air and materials which naturally provide a high level of galvanic isolation.

In many applications, including most power distribution systems located within an individual residence, it can be assumed that the voltage is closely modeled as a sinusoid with equal magnitude and minimal phase shift throughout the distribution system. As such, it may be possible to make a single measurement of line voltage, while making multiple measurements of the individual branch currents. However, separating the current and voltage measurement locations presents difficulties, particularly with tracking the relative phase information between the voltage and current required to estimate real power.

While a number of approaches have been proposed for measuring or estimating power, there remains a need for alternative approaches, advantageously approaches that are adapted for situations where the voltage and current on a given power circuit are to be measured at separate locations, or voltage is to measured at one location with current measured at multiple other locations.

SUMMARY

The present invention allows for tracking of voltage cycle when voltage and current measurements are taken at different locations on an AC power line, with the devices taking the measurements interconnected by an asynchronous data network. In general, a timing message is sent from the voltage sensing device to the current sensing device, with the timing message being transmitted at a predetermined point in the periodic voltage cycle. In some embodiments, the predetermined point in the voltage cycle may be a zero-crossing point of the voltage cycle, that is, a point in the voltage cycle when the sign of the voltage, measured relative to a reference, reverses. The receipt of the timing message by the current sensing side is used to establish a cycle reference time that is indicative of a phase of the voltage cycle on the power line. Typically, the cycle reference time is used to re-synchronize an internal model of the voltage cycle maintained by the current sensing device. The current sensing side measures current at the second location physically separated from the location where the voltage is measured. The actual power drawn is then calculated based on the current measured on the power line and the cycle reference time.

In one illustrative embodiment, present invention provides a method of measuring power. A first station at a first location measures an AC voltage on a power line having an AC voltage cycle. The first station is interconnected to a second station at a second location by an asynchronous network. A synch message is caused to be transmitted from the first station to a second station over the asynchronous network at a predetermined time in the AC voltage cycle of the power line. The second station detects the arrival of the synch message and establishes a cycle reference time based thereon. The cycle reference time is indicative of a phase of the voltage cycle on the power line. The second station measures current on the power line at the second location. Actual power drawn is calculated based on the current measured on the power line and the cycle reference time. Typically, the second station has a model of the voltage cycle on the power line. The second station's model of the voltage cycle is synchronized to the voltage cycle based on the cycle reference time. For example, a phase lock loop in the second station may be adjusted based on the phase information provided by the cycle reference time. The power drawn on the power line may then be calculated based on the current measured on the power line and the synchronized model of the voltage cycle on the power line. If desired, the synchronized model may be used to determine power on multiple branch circuits based on corresponding current measurements.

In another illustrative embodiment, the present invention provides a method of measuring power. A first station measures an AC voltage on a power line at a first location. A model of the time-varying voltage cycle on the power line is generated at a second station associated with a second location; the second location physically spaced from the first location. For example, the first and second locations may be on opposite sides of a breaker associated with the power line. A synch message is caused to be transmitted from the first station to the second station over an asynchronous network that interconnects the first and second stations at a predetermined time in the AC voltage cycle of the power line. A reference time is established based on detecting the arrival of the synch message at the second station. The second station's model of the voltage cycle on the power line is synchronized with the voltage cycle of the power line based on the reference time. The second station measures current on the power line at the second location. A power draw on the power line is calculated based on the current measured on the power line and the synchronized model of the voltage cycle on the power line. The method may include sending a timing alert message from the first station to the second station over the asynchronous network; with the synch message limited to being the next message on the asynchronous network from the first station after the timing alert message. Either the first or second stations may be the master station on the asynchronous network. The second station's synchronized model of the voltage cycle on the power line may be independent of the content of the synch message. The asynchronous network may operate according to a MODBUS protocol while practicing the invention.

In another embodiment, the present invention provides a method of measuring power that includes receiving, at a second station, a synch message on an asynchronous network from a first station; the start of the synch message synchronized to a predetermined point in a regularly varying voltage cycle on a power line as measured at a first location. A reference time is established based on detecting the arrival of the synch message at the second station. The second station measures current on the power line at a second location physically spaced from the first location. The second station determines a voltage at the time the current measuring occurs based on the reference time. A first power drawn on the power line is calculated based on the measured current and the determined voltage. The second station may generate a local model of the time-varying voltage cycle on the power line at the second station, with the second station's model of the voltage cycle synchronized with the voltage cycle of the power line based on the reference time. The calculating of the first power then includes calculating the first power drawn on the power line based on the measured current and the second station's synchronized model of the voltage cycle on the power line.

In another embodiment, the present invention provides a method of measuring power that includes monitoring a voltage at a first location on an AC power line by a first controller; the controller in communication with a current monitor via an asynchronous data communication network. The current monitor is operative to measure a current on the power line at a second location different from the first location. A timing alert message is sent from the controller to the current monitor over the asynchronous network. After sending the alert message, the controller synchronizes the transmission of a synch message from the controller with a predetermined point in the regularly varying voltage cycle of the power line, with the synch message being the next message transmitted from the controller via the asynchronous network after the timing alert message. A reference time is established at the current monitor based on detecting the arrival of the synch message at the current monitor. The current monitor measures current on the power line. The voltage of the power line corresponding to the time the current measuring occurs is determined based on the reference time. The power drawn on the power line is calculated based on the measured current and the determined voltage.

The power on one or more power lines, such as on the majority or all of the branch circuits associated with a load center, may be determined using the above methods. Further, corresponding structures are described. And, various aspects and embodiments are disclosed, which may be used alone or in any combination.

DETAILED DESCRIPTION

The present invention allows for tracking of the line voltage cycle when voltage and current measurements are taken at different physical locations on an AC power distribution system, with the devices taking the voltage and current measurements interconnected by an asynchronous data network. To do so, both the voltage and current measuring devices maintain an internal model of the line voltage. A timing message is sent from the voltage sensing device to the current sensing device, with the timing message being transmitted at a predetermined point in the periodic voltage cycle. The receipt of the timing message by the current sensing device is used to re-synchronize the internal model of the voltage cycle maintained by the current sensing device to the voltage cycle as measured by the voltage sensing device. In some embodiments, the predetermined point in the voltage cycle may be a zero-crossing point of the voltage cycle, that is, a point in the voltage cycle when the sign of the voltage, measured relative to a reference, reverses.

In one illustrative embodiment, the present invention provides a method of estimating real power. A first voltage measuring device (station) measures an AC voltage on an energized conductor delivering power at a first location and maintains an internal, mathematical model of the line voltage, based on the AC voltage measurements. A separate internal mathematical model of the time-varying voltage cycle on the power line is maintained by a second, current sensing device associated with a second location; the second location physically spaced from the first location. For example, the first and second locations may be on opposite sides of a circuit breaker associated with the AC power distribution system. A synchronizing message is transmitted over an asynchronous network from the first (voltage) station to the second (current) station at a predetermined point in the voltage cycle, based on the internal voltage cycle model of the voltage measuring device. The time at which this synchronizing message is received by the second (current) station is compared against the expected time of receipt of the message based on the internal model of voltage cycle maintained by second (current) station. The difference between the expected and actual receipt times is used to adjust the timing of the internal voltage cycle model at the second (current) station, with the objective to maintain the two internal voltage cycle models in synchronous relation with each other. The second station measures current on the power line at the second location. A power draw on the power line is calculated based on the current measured on the power line and the synchronized model of the voltage cycle on the power line.

Figure 1:
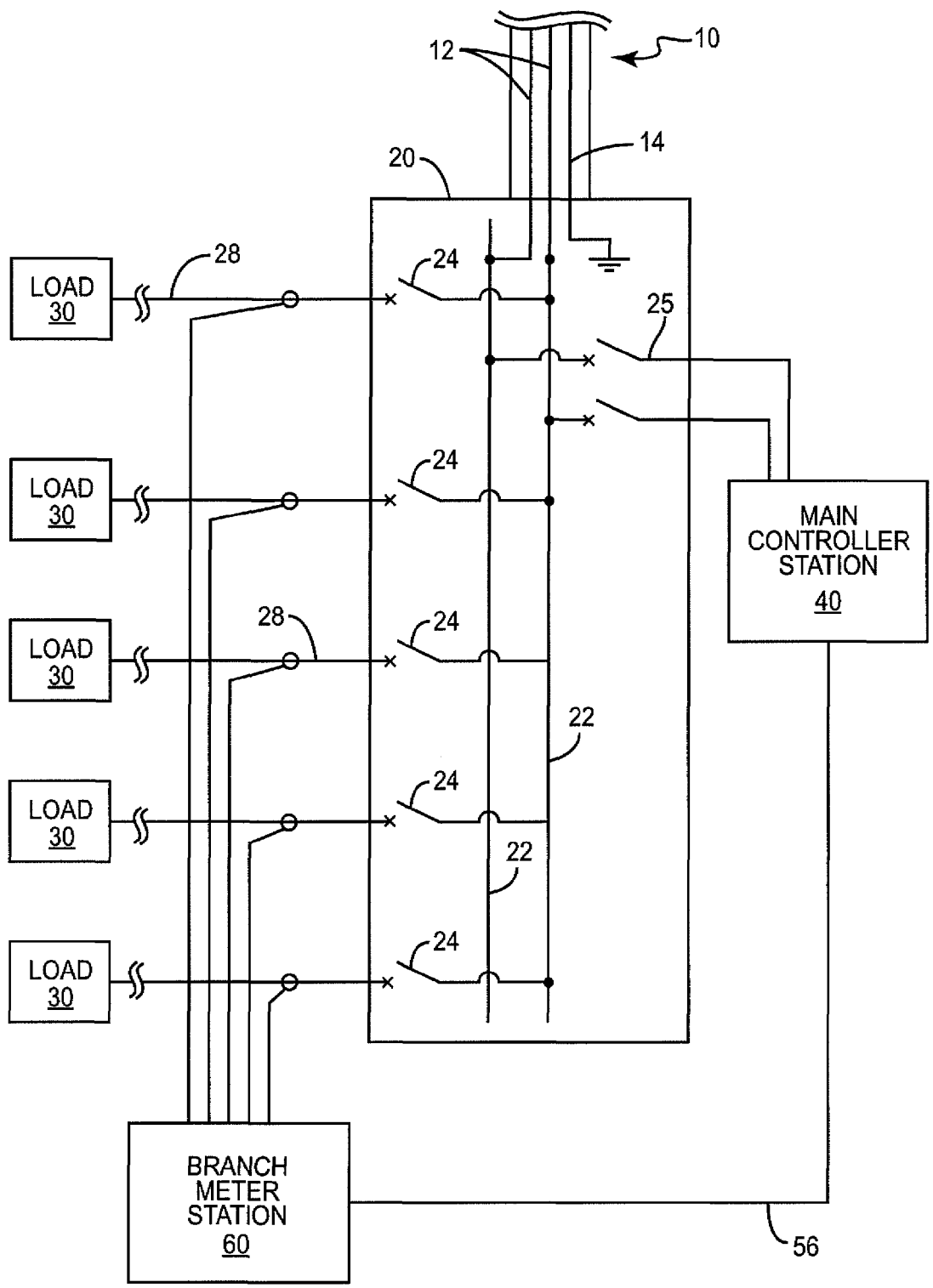
FIG. 1 shows load center with an associated main control station, branch metering station, and asynchronous data network.

Referring to FIG. 1, a power distribution system in the form of a load center power control scenario is illustrated, with a main power supply cable 10, a load center 20, a main control station 40, and a branch metering station 60. The main power supply cable 10 includes a plurality of conductors, typically including two phase conductors 12 and a neutral conductor 14 (which may be at earth or "ground" potential via the technique known as bonding). As is conventional, the two phase conductors 12 have AC voltage thereon that are 180° apart in phase with the RMS value of the voltage between each of the two phase conductors 12 and the neutral conductor 14 nominally equal.

The load center 20 routes power from the main power supply cable 10 to a plurality of loads 30 on respective branch circuit power lines 28. As is conventional, the load center 20 includes an array of circuit breakers 24 electrically disposed between the phase conductors 12 and the branch circuit 28. Typically, each phase conductor 12 is connected with a corresponding power bus 22, and the circuit breakers 24 each interconnect a corresponding branch circuit 28 to the power bus 22. However, some circuit breakers 24 may interconnect the two different phase conductors 12 to supply power to a load operating on a different AC voltage, for example a 240V AC load. The branch circuits 28 provide power to various loads 30, such as an HVAC unit, a hot water heater, etc., as is conventional.

Figure 2:
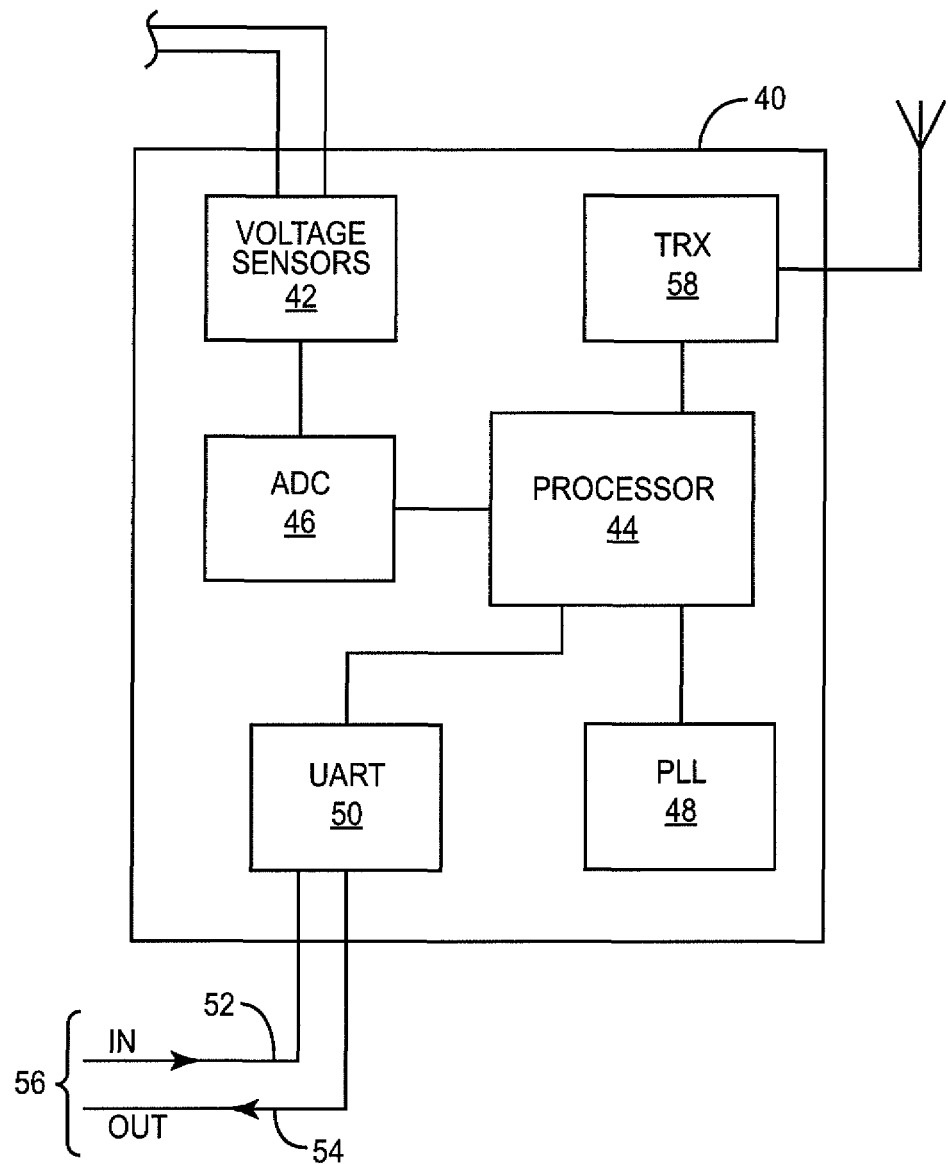
FIG. 2 shows the main control station of FIG. 1.

Referring to FIG. 2, the main control station 40 is operatively connected to the load center 20 for monitoring and/or controlling the load center 20. The main control station 40 includes a processor 44, a voltage sensor 42, an analog-to-digital converter (ADC) 46, a phase reference generator in the form of a phase lock loop (PLL) 48, an asynchronous data network transceiver 50, and a wireless data network transceiver 58. The processor 44 runs the software to control the overall function of the main control station 40. The voltage sensor 42 senses the voltage on one of the phase conductors 12 or between the phase conductors 12, and may take any suitable form known in the art. The voltage sensor 42 may, if desired, be disposed in parallel with the breakers 24, and protected by a dedicated breaker 25 that does not lead to branch circuits 28. The unprotected side of the dedicated breaker 25 may be the phase conductor 12 itself, or may be the corresponding power bus 22 inside the load center 20. The voltage sensor 42 may be disposed in the main control station 40 or in the load center 20, as is desired. The voltage sensor 42 typically outputs an analog signal representative of the instantaneous voltage on the corresponding phase conductor(s) 12. The ADC 46 is used to convert the analog signal to a digital sequence form suitable for use by the processor 44. The sensed voltage is used to drive the PLL 48, which is used to track the voltage phase cycle. The PLL 48 may be dedicated circuits external to the processor or algorithmic emulations inside processor 44 utilizing the digital sequence, as is desired. The asynchronous data network transceiver 50 allows for data communication between the main control station 40 and the branch metering station 60 over an asynchronous data network 56 such as a MODBUS network, as discussed further below (MODBUS is a trademark of Schneider Automation Inc. of N. Andover, Mass.). The asynchronous data network 56 of FIGS. 1-3 has an output circuit or line 54 and an input circuit or line 52 (from the perspective of the main control station 40) that lead to branch metering station 60. The wireless data network transceiver 58 allows for data communication between the main control station 40 and various remote locations using any suitable wireless protocol, such as a ZIGBEE protocol (ZIGBEE is a trademark of Zigbee Alliance of San Ramon, Calif.).

Figure 3:
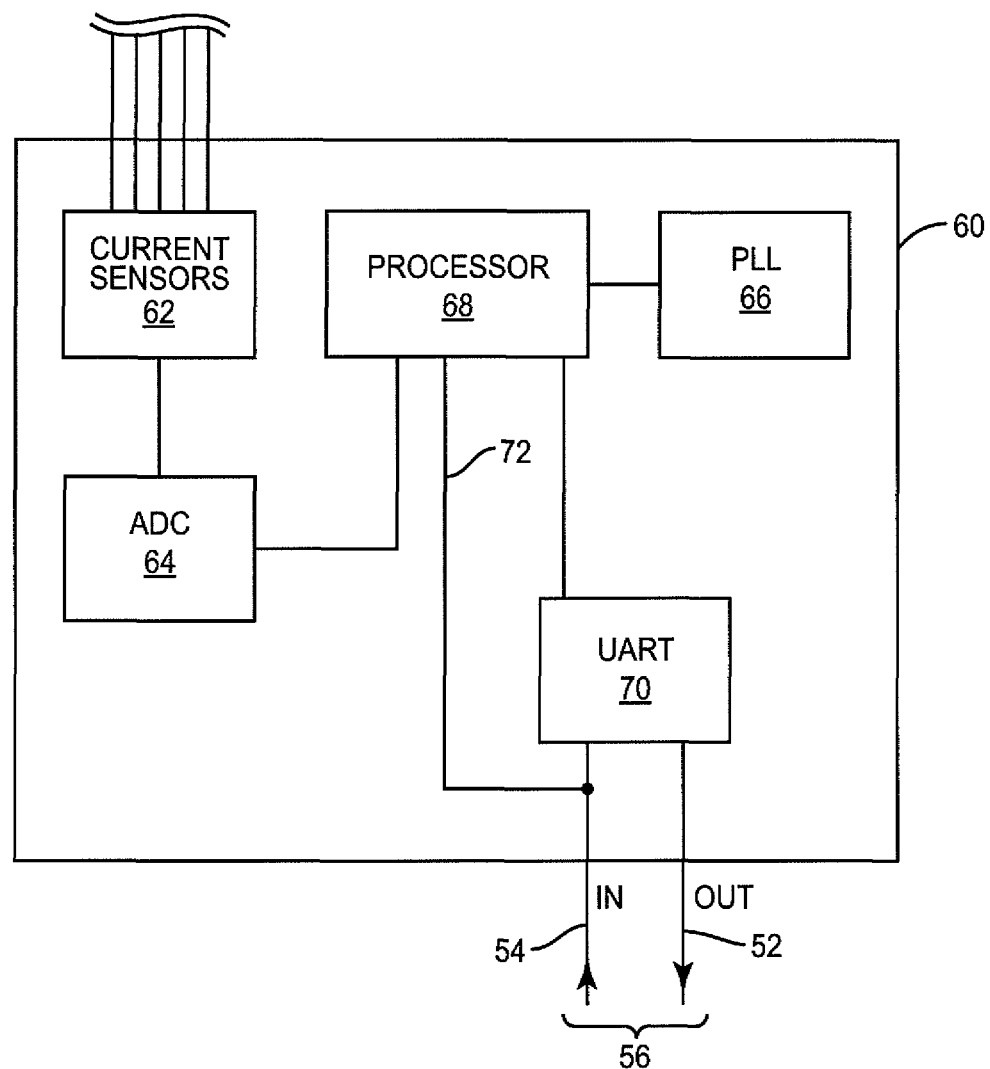
FIG. 3 shows the branch metering station of FIG. 1.

Referring to FIG. 3, the branch metering station 60 is operatively connected to the branch circuits 28 for monitoring the current load on the branch circuits 28. The branch metering station 60 includes a processor 68, one or more current sensors 62, one or more ADC's 64, a phase reference generator or modeler in the form of a PLL 66, an asynchronous data network transceiver 70, and an incoming data sense line 72. The processor 68 runs the software to control the overall function of the branch metering station 60. The current sensors 62 sense the current on their respective branch circuits 28. These current sensors 62 may take any suitable form known in the art, such as a current transformer (CT). Each current sensor 62 typically outputs an analog signal representative of the measured current. Suitable ADC's 64, preferably with suitable anti-aliasing functions, are used to convert the analog signals to a digital sequence form suitable for use by the processor 68. The PLL 66 is used to model the voltage cycle on branch circuits 28, as discussed further below. The asynchronous data network transceiver 70 allows for data communication between the main control station 40 and the branch metering station 60 over the asynchronous data network 56. From the perspective of the branch metering station 60, line 54 is an input line and line 52 is an output line for the asynchronous data network 56. The incoming data sense line 72 leads to the processor 68 from just upstream of the asynchronous data network transceiver 70. The incoming data sense line 72 allows the processor 68 to sense when a message is incoming to the branch metering station 60, without having to examine the payload of the incoming message.

As discussed above, the main control station 40 monitors the AC voltage cycle. The main control station 40 uses its PLL 48 to model the time-varying AC voltage cycle on the phase conductor(s) 12. As pointed out above, the measurement may be on either one of the phase conductors 12, or between them, given that the relationship of the voltage cycles on the two phase conductors 12 is fixed at 180° apart in phase, and that both can be measured relative to the same reference, e.g., neutral. The processor 44 then uses the PLL data to identify when a predetermined point in the voltage cycle occurs. For example, the processor 44 may use the PLL data to identify when the zero-crossing occurs, although any other point in the voltage cycle may alternatively be used. For information about how to identify the zero-crossing, attention is directed to U.S. Patent Application Publication 2007/0085518.

When the main control station 40 needs to determine the power drawn on a branch circuit 28, the main control station 40 sends the branch metering station 60 a timing alert message via the asynchronous data network 56. After the branch metering station 60 acknowledges the timing alert message, the main control station 40 sends a synch message to the branch metering station 60 via the asynchronous data network 56. The synch message is transmitted by the main control station 40 such that the beginning of transmission coincides with the predetermined point in the voltage cycle. Thus, using the zero-crossing point as an example, the main control station 40 holds transmission of the synch message until the zero-crossing time, as indicated by the phase model of the PLL 48. In addition, the synch message is the immediate next message transmitted by the main control station 40 after the timing alert message. As such, no other messages are allowed to be transmitted by the main control station 40, after the timing alert message, until the synch message is transmitted, unless there is no acknowledgement of the timing alert message by the branch metering station 60. In the event of failure to acknowledge, the process may restart, declare an error, or take other action as appropriate.

The branch metering station 60 may be continuously monitoring the current on the branch circuit(s) 28, or sampling them at a high rate. In order to determine better power measurements, the voltage on the branch circuit 28 should be known (e.g., estimated) at the same time as the current measurement is taken. To do this, the branch metering station 60 models the voltage phase cycle of the branch circuit 28, using the corresponding PLL 66. However, because the branch metering station 60 does not actually measure the voltage, the voltage model may drift over time and become out of synch with the actual voltage on the branch circuit 28. To combat this, the branch metering station 60 uses the synch message from the main control station 40 to re-synchronize the PLL 66 to the voltage phase cycle as measured by the main control station 40. To do so, the branch metering station 60 detects the presence of the next incoming message after the timing alert message—with that message necessarily being the synch message—using the incoming data sense line 72. The presence incoming message is detected by the processor 68 via the incoming data sense line 72. Because this message—being the synch message—was transmitted at a known point in the voltage cycle, the processor 68 "knows" when this point in the voltage cycle occurred, and can adjust the PLL 66 accordingly to re-synchronize the PLL 66 with the voltage cycle. For example, the processor 68 can compare the time of receipt of the synch message against the presently maintained timing of the reference point of the internal voltage model, and can then use the difference between the two (if any) to adjust the PLL 66 accordingly in order to re-synchronize the PLL 66 with the voltage cycle. Then, using the timing provided by the synchronized internal voltage model, the processor 68 can match the current measurements on one or more branch circuits 28 with their corresponding points in the voltage cycle, as indicated by the PLL model, and determine the power drawn on the branch circuit(s) 28. Thus, while the branch metering station 60 does not measure the voltage cycle itself, the branch metering station 60 maintains a model of the voltage cycle through access to the voltage information from the main control station 40, properly synchronized via the asynchronous data network 56.

The calculation of the power for a given branch line may be done by analyzing an array of data point pairs of the voltage (from the model) and the measured current over a one cycle. The values of the pairs could be multiplied together and summed over the cycle period to determine the real power. Such an arrangement may be useful if the current waveform differs significantly from sinusoidal. Alternatively, if a sinusoidal form of both voltage and current is assumed, the phase difference between the current and voltage could be determined by comparing predetermined points (e.g., "rising" zero crossings) of the two waveforms, to determine their relative phase angles. The power then could be determined simply by multiplying the RMS voltage (supplied by voltage measuring side, or an assumed value such as 120V) times the RMS current (derived from the current measurements) times the cosine of the phase angle (derived from the synchronization data).

Note that the synchronization of the PLL 66 is not dependent on the content of the synch message, merely detection of its incoming presence at the branch metering station 60. As such, the synchronization is not dependent on the asynchronous data network transceiver 70 processing the synch message. Thus, the processing delay of the asynchronous data network transceiver 70 does not negatively affect the accuracy of the synchronization. Furthermore, the effects of any zero-mean "jitter" in the timing of the synch message can be minimized by appropriate PLL design.

As discussed above, the main control station 40 monitors the voltage of the incoming power on the phase conductor(s) 12. Because the phase of the voltage cycle on the branch circuits 28 may be considered to be the same as the phase of the voltage cycle on the corresponding phase conductor 12, measurement of the voltage of the phase conductor 12 is considered to be measurement of the voltage of the corresponding branch circuit(s) 28. The effect of any propagation delay of the voltage cycle between the two different locations where the voltage is measured and the current is measured can be assumed to be negligible, even more so if one considers the almost non-existent propagation delay difference between the power circuits and the transmissions on the asynchronous data network 56.

The use of physically separated and galvanically isolated measurements of voltage and current allows the current measurement circuits to be designed less stringently, allowing for tighter spacing between components and circuit board runs, lower cost components, and more efficient packaging. Also, in embodiments where multiple current measurements are referenced to a single voltage measurement location, the duplication of voltage measurement circuitry may also avoided.

In some embodiments, the branch metering station 60 may use assumptions about the frequency of the AC power (e.g., sixty hertz), its RMS voltage (e.g., 120V), and the voltage profile (e.g., sinusoidal) in order to calculate the power. In other embodiments, the branch metering station 60 may receive information about the voltage cycle from the main control station 40. For example, the main control station 40 may provide the branch metering station 60 with the frequency, RMS voltage, and/or an array of parameters describing the voltage cycle profile, so that the branch metering station 60 may more accurately model the voltage cycle. This information may be sent to the branch metering station 60 in dedicated messages, on any suitable schedule, as it typically does not vary quickly over time. Alternatively, the information may be sent as part of the timing alert message, so as to be as fresh as possible.

In some embodiments, the branch metering station 60 performs the calculations to determine the power drawn on a given branch circuit 28, based on the measured current and the voltage information. In other embodiments, the main control station 40 may perform the calculations, with the branch metering station 60 providing the appropriate current and phase information to the main control station 40 via the asynchronous data network 56. For example, the branch metering station 60 may supply an array of data points, with each row having data pairs of current and phase angle corresponding to a plurality of measurements for a given branch line 28 for a single current cycle on that branch line 28, and different row corresponding to different branch lines 28. The array of data may be transmitted from the branch metering station 60 to the main control station 40 as conventional data over the asynchronous data network 56.

The discussion above has been in the context of the main control station 40 being the master of the asynchronous data network 56 and measuring the voltage, and the branch metering station 60 being a slave in the asynchronous data network 56 and measuring the current. However, in some embodiments, the current side may be the master and the voltage side may be the slave. If so, then the synchronization process may proceed with the master (current side) sending a request to the slave (voltage side). The request tells the slave that the response should carry synchronization. The slave then waits for the predetermined point in the voltage cycle and starts transmitting the acknowledgement message in synch with the predetermined point in the voltage cycle. The master detects the presence of the acknowledgment response via its incoming data sense line 72, as discussed above.

In some embodiments, the branch metering station 60 may track the current on one or more branch circuits 28 by sampling at a high rate, and use the generally periodic changes in current as an oscillator rather than a dedicated PLL 66. Further, in some embodiments, the main control station 40 may, in addition to providing the voltage reference, also measure the current on one circuit and calculate the power for that circuit, but still share the voltage information with the branch metering station 60 for use with the current measured for other circuits.

In the discussion above, it has been assumed that there is one branch metering station 60. However, in some embodiments, there may be multiple branch metering stations 60 on the asynchronous data network 56, all modeling the voltage cycle based on the voltage/synchronization data from a single main control station 40. Such an arrangement is believed to work best if the main control station 40 is the "master" station on the asynchronous data network 56.

The discussion above has used a MODBUS network as an example of an asynchronous data network 56. It should be understood that the asynchronous network 56 could alternatively operate according to any suitable asynchronous network protocol. Further, the illustrative description above has assumed that the incoming data sense line 72 taps line 54. Such an arrangement works well in so-called four-wire MODBUS arrangement, where each line 52, 54 comprises a pair of wires. However, a similar arrangement for a so-called two-wire MODBUS asynchronous network 56 may have incoming data sense line 72 tapping line 52, as line 52 may be both the input and the output line for the branch metering station 60.

The discussion above has generally been in the context of the branch metering station 60 modeling the voltage cycle via a phase reference generator such as PLL 66. Such an approach is believed to be advantageous. However, other approaches to modeling the voltage cycle may alternatively and/or additionally be used. For example, the branch metering station 60 may model the voltage cycle using a table rather than PLL 66. The table may contain values of voltage that are determined prior to receipt of the synch message, based on assumptions about the voltage cycle. For example, assuming that the voltage is 120 volts RMS at 60 Hz, and that one wanted to take 128 samples within a cycle, a fixed table of values representing the voltage at 128 points in the cycle (e.g., 130.2 microseconds apart for a 60 Hz cycle) could be precalculated. Assuming that the predetermined point in the voltage cycle is the zero-crossing point, the first value would be zero, with the next value being the voltage 130.2 microseconds later (e.g., 5.89 volts), and so forth. The branch metering station 60 could then take 127 current measurements at 130.2 microsecond intervals, starting 130.2 microseconds after detecting receipt of the synch message on incoming data sense line 72, multiply each successive current measurement by the corresponding voltage entry in the table, sum the results, and divide by the number of intervals (e.g., 128) to calculate the power. Note that this scenario takes advantage of the fact that voltage is zero at the zero-crossing point (coinciding with the receipt of the synch message); thus, the first current measurement may be skipped because it will be multiplied by zero. Thus, the use of a table of values corresponding to the voltage of the voltage cycle, with the values determined prior to the receipt of the synch message, should be considered as modeling the voltage cycle. Likewise, using the values of the table in a fashion that aligns the table-based model with the voltage cycle based on the reference time established by the receipt of the synch message should be considered as synchronizing the model based on the reference time. It should be noted that the table-based approach may be less flexible in implementation than a PLL-based approach.

In another table-based approach, the branch metering station 60 may use a PLL 66 to adjust the current sampling interval to match the line frequency. For example, the processor 68 may compute the actual present line frequency based on the PLL 66. The processor 68 may then adjust the timing between current samples such that voltage table values more accurately reflect the line voltage. For instance, if the frequency is 60.5 Hz rather than 60.0 Hz, the processor 68 could adjust the sampling interval to be 129.1 microseconds. Likewise, if the frequency were 59.5 Hz, the processor 68 could adjust the timing interval to be 131.3 microseconds. The predetermined table of voltage values could then be used as described above, with the values more properly representing the voltage values of the voltage sinusoid at that frequency.

In some embodiments, every message transmission from the main control station 40 may be synchronized to the predetermined point in the voltage cycle. For example, the main control station 40 may be programmed to hold transmission on any message on the asynchronous network 56 so that transmission of the message coincides with the predetermined point in the voltage cycle. In such situation, each message sent by the main control station 40 is a synch message.

The various aspects of the various embodiments may be found individually in various embodiments, or in any combination. Further, any patents and patent publications mentioned above are each incorporated herein by reference in their entirety.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of measuring power comprising:
   measuring, by a first station at a first location, an AC voltage on a power line having an AC voltage cycle;
   causing a synch message to be transmitted from the first station to a second station over an asynchronous network that interconnects the first and second stations at a predetermined time in the AC voltage cycle of the power line; the second station associated with a second location physically spaced from the first location; the second station having a model of the voltage cycle on the power line;
   detecting the arrival of the synch message at the second station and establishing a cycle reference time based thereon; the cycle reference time indicative of a phase of the voltage cycle on the power line;
   synchronizing the second station's model of the voltage cycle to the voltage cycle based on the cycle reference time;
   measuring, by the second station, current on the power line at the second location;
   calculating a power drawn on the power line based on the current measured on the power line, the synchronized model of the voltage cycle on the power line, and the cycle reference time.

2. The method of claim 1 wherein the synchronizing the second station's model comprises adjusting a phase lock loop of the second station.

3. The method of claim 1:
   further comprising, prior to the causing the synch message to be transmitted, transmitting a plurality of voltage cycle parameters associated with the voltage cycle on the power line from the first station to the second station;
   further comprising generating the second station's model of the time-varying voltage cycle on the power line based on the plurality of voltage cycle parameters.

4. The method of claim 1 wherein the second station's model of the voltage cycle comprises a table of values determined prior to the detecting the arrival of the synch message at the second station.

5. The method of claim 1 wherein the first station is a master station on the asynchronous network and the second station is a slave station on the asynchronous network.

6. The method of claim 1 further comprising:
sending a timing alert message from the first station to the second station over the asynchronous network prior to sending the synch message;
wherein the synch message is the next message on the asynchronous network from the first station after the timing alert message.

7. The method of claim 1 wherein the predetermined time in the AC voltage cycle is a zero-crossing of the voltage on the power line.

8. The method of claim 1 further comprising periodically repeating the steps of:
causing a synch message to be transmitted;
establishing a cycle reference time; and
calculating a power drawn on the power line based on the current measured on the power line and the cycle reference time.

9. The method of claim 1 wherein the power line is a first power line, and further comprising:
measuring, by the second station, current on a second power line at a third location separate from the first location;
after receipt of the synch message, calculating a power drawn on the second power line based on the current measured on the second power line and the cycle reference time.

10. The method of claim 1 wherein the asynchronous network operates according to a MODBUS protocol.

11. A method of measuring power comprising:
receiving, at a second station, a synch message on an asynchronous network from a first station; the start of the synch message synchronized to a predetermined point in a regularly varying voltage cycle on a power line as measured at a first location; the second station having a model of the voltage cycle on the power line;
establishing a reference time based on detecting the arrival of the synch message at the second station;
synchronizing the second station's model of the voltage cycle on the power line with the voltage cycle of the power line based on the reference time;
measuring a current on the power line by the second station at a second location on the power line physically spaced from the first location;
determining, by the second station, a voltage at the time the current measuring occurs based on the reference time;
calculating a first power drawn on the power line based on the measured current, the synchronized model of the voltage cycle on the power line, and the determined voltage.

12. The method of claim 11:
further comprising, prior the receiving the synch message, the first station sending a timing alert message via the asynchronous network to the second station;
wherein the synch message is the next message on the asynchronous network from the first station after the timing alert message.

13. The method of claim 11 wherein the power line is a first power line, and further comprising:
measuring, by the second station, current on a second power line;
determining, by the second station, a voltage at the time the current measuring on the second power line occurs based on the reference time;
after receipt of the synch message, calculating a power draw on the second power line based on the current measured on the second power line and the determined voltage.

14. A method of measuring power comprising:
monitoring a voltage at a first location on an AC power line by a first controller; the controller in communication with a current monitor via an asynchronous data communication network; the current monitor operative to measure a current on the power line at a second location different from the first location and operative to model the voltage cycle on the power line;
sending a timing alert message from the controller to the current monitor over the asynchronous network;
after sending the alert message, synchronizing the transmission of a synch message from the controller with a predetermined point in the regularly varying voltage cycle of the power line; the synch message being the next message transmitted from the controller via the asynchronous network after the timing alert message;
establishing a reference time at the current monitor based on detecting the arrival of the synch message at the current monitor;
synchronizing the current monitor's model of the voltage cycle to the voltage cycle of the power line based on the reference time;
measuring current on the power line by the current monitor;
determining the voltage of the power line corresponding to the time the current measuring occurs based on the reference time;
calculating a power draw on the power line based on the measured current, the synchronized model of the voltage cycle on the power line, and the determined voltage.

15. The method of claim 14 wherein the power line is a first power line, and further comprising calculating a power draw on a second power line based on the reference time prior to receipt of a subsequent synch message.

16. An apparatus for measuring power drawn on a power line, comprising:
a first station having a voltage sensor operative to measure an AC voltage on a power line having a regularly varying voltage cycle at a first location;
a second station interconnected to the first station by an asynchronous data network; the second station having a current sensor operative to measure current on the power line at a second location physically spaced from the first location; the second station having a model of the voltage cycle on the power line;
the first station adapted to synchronize the sending of a synch message to the second station on the asynchronous network with a predetermined point in the voltage cycle as measured at the first location;
the second station adapted to:
establish a reference time based on detecting the arrival of the synch message at the second station;
synchronize the model of the voltage cycle based on the reference time;
measure a current on the power line at the second location;
determine a voltage at the time the current measuring occurs based on the synchronized model;
calculate a first power drawn on the power line based on the measured current and the determined voltage.

17. The apparatus of claim 16 wherein the first station is a master station on the asynchronous network and the second station is a slave station on the asynchronous network.

18. The apparatus of claim 16:
- wherein the second station comprises a plurality of current sensors;
- wherein the second station is adapted to measure the power drawn on a plurality of power lines based on measurements from corresponding current sensors and the synchronized model.

* * * * *